United States Patent [19]

Ohata et al.

[11] Patent Number: 5,331,659
[45] Date of Patent: Jul. 19, 1994

[54] OPTICAL SEMICONDUCTOR DEVICE

[75] Inventors: Toyoharu Ohata; Kazuhiko Nemoto; Masamichi Ogawa, all of Kanagawa, Japan

[73] Assignee: Sony Corporation, Tokyo, Japan

[21] Appl. No.: 31,098

[22] Filed: Mar. 11, 1993

[30] Foreign Application Priority Data

Mar. 13, 1992 [JP] Japan .................................. 4-089433
Mar. 16, 1992 [JP] Japan .................................. 4-090277

[51] Int. Cl.$^5$ ................................................ H01S 3/19
[52] U.S. Cl. .......................................... 372/50; 372/45
[58] Field of Search ................................... 372/50, 45

[56] References Cited

U.S. PATENT DOCUMENTS

| | | | |
|---|---|---|---|
| 4,833,511 | 5/1989 | Sugimoto | 372/50 |
| 4,969,152 | 11/1990 | Burghardt et al. | 371/50 |
| 5,068,870 | 11/1991 | Yagi et al. | 372/50 |
| 5,202,896 | 4/1993 | Taylor | 372/50 |

*Primary Examiner*—Georgia Y. Epps
*Attorney, Agent, or Firm*—Hill, Steadman & Simpson

[57] ABSTRACT

An optical semiconductor device in which both of positive input and negative input are possible is disclosed. In the optical semiconductor device, two heterojunction phototransistors are connected in parallel of each other to the cathode of a laser diode. An optical memory in which setting, i.e., writing and resetting, i.e., erasing by light are possible is also disclosed. In the optical memory, two heterojunction phototransistors are connected in parallel of each other to the cathode of a laser diode to make a memory cell.

14 Claims, 11 Drawing Sheets

OPTICAL SEMICONDUCTOR DEVICE

BACKGROUND OF THE INVENTION

1. Field of the Invention

This invention relates to an optical semiconductor device and, more particularly, to one in which a light emitting element and a photodetector are integrated on a single semiconductor substrate.

2. Description of the Prior Art

Various optical semiconductor devices combining a light emitting element and a photodetector have been reported. For example, IEEE Trans. Electron Devices, vol. ED-31, No. 6,805(1984) discloses an optical semiconductor device in which a single double-heterojunction light emitting diode used as a light emitting element is integrated on the collector of a single heterojunction phototransistor used as a photodetector.

However, in the conventional optical semiconductor device referred to above, since the photodetection side merely behaves as its positive input (on-input), it is impossible to realize both positive input and negative inputs (off-input).

On the other hand, recently, there has been a proposal to realize an optical memory by using an optical semiconductor device.

For example, in 1989 Spring National Meeting of Society of Electronics, Information and Telecommunication, Digest of Lecture C-412, p. 4-201, there is proposed an optical parallel memory in which a memory cell is made by connecting in series a single heterojunction phototransistor used as a photodetector and a single light emitting diode used as a light emitting element.

In 1990 Spring National Meeting of Society of Electronics, Information and Telecommunication, Digest of Lecture C-176, p. 4-231, there is proposed an optical erasure type optical parallel memory in which a memory cell is made by connecting in series a single heterojunction phototransistor used as a photodetector and a single light emitting diode used as a light emitting element and by connecting another heterojunction phototransistor used as a photodetector for reset in parallel with the former heterojunction phototransistor and the light emitting diode.

In the conventional optical parallel memory referred to above, setting by light, i.e. writing, is possible by turning on the heterojunction phototransistor in response to a light input and by turning on the light emitting diode. However, resetting, i.e. erasure, is not possible unless the power source is turned off.

In the conventional optical erasure type optical parallel memory referred to above, erasure by light is possible without turning off the power source due to the use of the heterojunction phototransistor for reset. This, however, has a structure in which the light emitting diode used as a light emitting element overlies the heterojunction phototransistor used as a photodetector, and make parallel division of the photodetection portion difficult. Additionally, the optical erasure type optical parallel memory uses a memory cell having a structure in which two phototransistors are connected in parallel with each other to one of terminals of a single light emitting element, which is essentially different in circuit arrangement from memory cells in optical semiconductor devices according to the present invention.

OBJECTS AND SUMMARY OF THE INVENTION

It is therefore an object of the invention to provide an optical semiconductor device in which both positive input and negative input are possible.

Another object of the invention is to provide an optical semiconductor device in which setting or writing and resetting or erasure by light are possible.

Still another object of the invention is to provide an optical semiconductor device in which parallel division of its photodetection portion is readily realized.

According to an aspect of the invention, there is provided an optical semiconductor device comprising: a light emitting element; a first phototransistor; and a second phototransistor, the first and second phototransistors being connected in parallel with each other to one end of the light emitting element.

According to another aspect of the invention, there is provided an optical semiconductor device comprising: a light emitting element; a first phototransistor; and a second phototransistor, the light emitting element and at least one of the first and second phototransistors being stacked with each other, and the first and second phototransistors being connected in parallel with each other to one end of the light emitting element.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
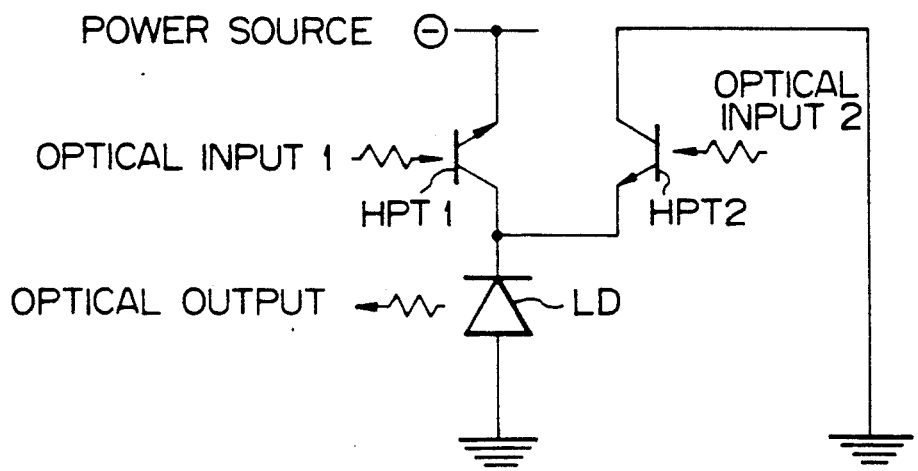
FIG. 1 is a circuit diagram illustrating an optical semiconductor device according to a first embodiment of the invention.

FIG. 1 shows an optical semiconductor device according to a first embodiment of the invention.

As shown in FIG. 1, in the optical semiconductor device according to the first embodiment, to the cathode of a laser diode LD, with its anode grounded, are connected two heterojunction phototransistors HPT1 and HPT2 in parallel and in opposite polarities with each other. In this case, the collector of the heterojunction phototransistor HPT1 is connected to the cathode of the laser diode LD, and the emitter is supplied with a negative voltage from a negative power source. In addition, the emitter of the heterojunction phototransistor HPT2 is connected to the cathode of the laser diode LD, and the collector is grounded. Alternatively, the collector of the heterojunction phototransistor HPT2 may be supplied with a positive voltage from a positive power source.

In the optical semiconductor device according to the first embodiment having the foregoing structure, an optical output is obtained from the laser diode LD in response to an optical input 1 to the base of the heterojunction phototransistor HPT1 and an optical input 2 to the base of the heterojunction phototransistor HPT2. That is, when the heterojunction phototransistor HPT1 is held on by the optical input 1, an optical output is obtained because of lasing caused by a flow of a forward current above a threshold current in the laser diode LD. However, when the heterojunction phototransistor HPT2 is turned on by the optical input 2, the current is permitted to flow also through the heterojunction phototransistors HPT1 and HPT2, which results in a decrease in the forward current flowing in the laser diode LD below the threshold current, and no optical output being obtained. In this case, the optical input 1 behaves as a positive input, and the optical input 2 as a negative input. That is, both of positive and negative inputs are possible.

Figure 2:
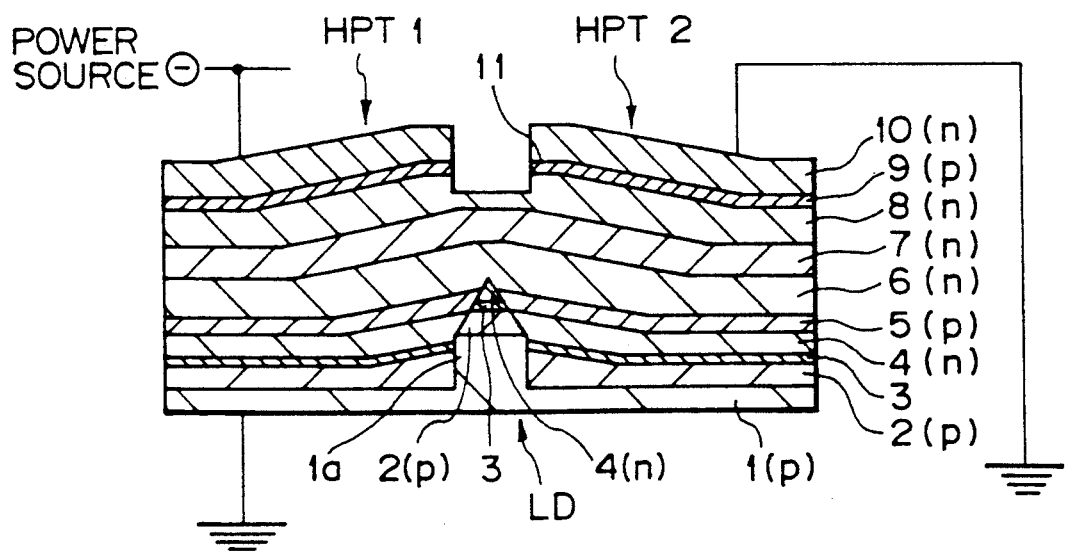
FIG. 2 is a cross sectional view illustrating an example of a structure of the optical semiconductor device according to the first embodiment of the invention.

FIG. 2 shows a specific structure of the optical semiconductor device according to the first embodiment of the invention.

As shown in FIG. 2, in the optical semiconductor device, a laser diode LD in the form of an SDH (Separated Double Hetero) laser, and heterojunction phototransistors HPT1 and HPT2 are monolithically integrated on a p-type GaAs substrate 1.

In this case, a cavity of an SDH laser constituting the laser diode LD is made of a p-type AlGaAs layer 2 used as a p-type cladding layer which is provided on a stripe-shaped ridge 1a formed on a surface of the p-type GaAs substrate 1 and extending in one direction, an active layer 3 in the form of, for example, an i-type GaAs layer, provided on the layer 2, and an n-type AlGaAs layer 4 used as a first n-type cladding layer provided on the layer 3. Reference numeral 5 refers to a p-type AlGaAs layer used as a current block layer, and 6 to an n-type AlGaAs layer used as a second n-type cladding layer. Description on SDH lasers is found, for example, in 12th IEEE International Semiconductor Laser Conference, paper F-1, 78(1990).

On the n-type AlGaAs layer 6 is provided an n-type GaAs layer 7 used as a light absorbing layer on which an n-type AlGaAs layer 8, a p-type GaAs layer 9, and an n-type AlGaAs layer 10 are provided in sequence. In portions of the n-type AlGaAs layer 8, the p-type GaAs layer 9 and the n-type AlGaAs layer 10 above the ridge 1a is provided a groove 11 for isolating the heterojunction phototransistors HPT1 and HPT2. The n-type AlGaAs layer 8, the p-type GaAs layer 9, and the n-type AlGaAs layer 10 on one side of the groove 11 (the left side in FIG. 2) are used as a collector layer, a base layer, and an emitter layer to make the heterojunction phototransistor HPT1. The n-type AlGaAs layer 8, the p-type GaAs layer 9, and the n-type AlGaAs layer 10 on the other side of the groove 11 (the right side in FIG. 2) are used as an emitter layer, a base layer, and a collector layer to make the heterojunction phototransistor HPT2.

In the optical semiconductor device shown in FIG. 2, since the heterojunction phototransistors HPT1 and HPT2 are stacked on the laser diode LD via the n-type GaAs layer 7 used as the light absorbing layer, the laser diode LD and the heterojunction phototransistors HPT1 and HPT2 are optically independent of each other because an output light from the laser diode LD is absorbed by the n-type GaAs layer 7. Additionally, parallel division of the photodetection portion is realized very easily by the structure in which the heterojunction phototransistors HPT1 and HPT2 are stacked on the laser diode LD.

The heterojunction phototransistors HPT1 and HPT2 in the optical semiconductor device shown in FIG. 2 are preferably arranged so that the n-type AlGaAs layer 8 and the n-type AlGaAs layer 10 used as the emitter layer or the collector layer are in absolute symmetry about the p-type GaAs layer 9 used as the base layer both in energy gap and in carrier connection. By employing the symmetric structure of the heterojunction phototransistors HPT1 and HPT2 about the base layer, the following advantage is obtained. That is, since the heterojunction phototransistor HPT1 for positive input and the heterojunction phototransistor HPT2 for negative input are opposite in the emitter and the collector, in order to design the heterojunction phototransistors HPT1 and HPT2 independently, it is ideal to make the emitter layer, the base layer and the collector layer for the heterojunction phototransistor HPT1 separately from the emitter layer, the base layer and the collector layer for the heterojunction phototransistor HPT2. Nevertheless, by employing the symmetric structure of the heterojunction phototransistors HPT1 and HPT2 about the base layer, absolutely the same characteristic is obtained even by oppositely using the emitters and collectors in the heterojunction phototransistors HPT1 and HPT2, which makes it possible to make the heterojunction phototransistors HPT1 and HPT2 without paying attention to their polarities. As a result, entire design of the element and the process for making the element are very easy.

Figure 3:
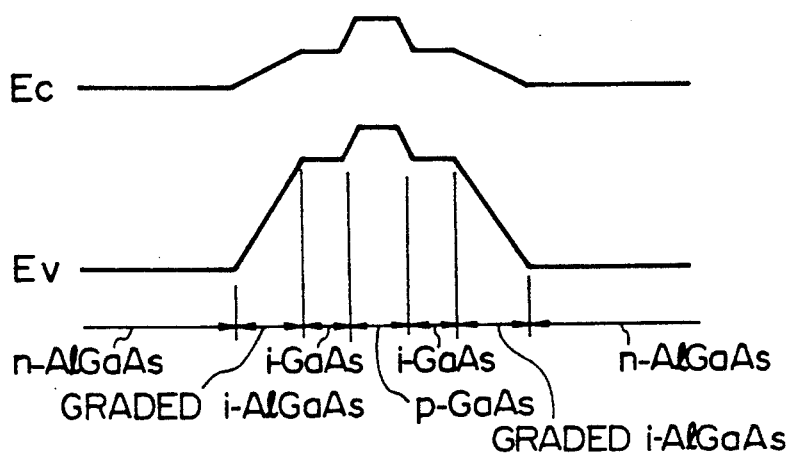
FIG. 3 is an energy band diagram illustrating an energy band structure of heterojunction phototransistors in optical semiconductor devices according to the first and a second embodiment of the invention.

The heterojunction phototransistors HPT1 and HPT2 are preferably arranged, for example, as shown in FIG. 3. In FIG. 3, $E_c$ refers to the energy at the bottom of the conduction band, and Ev to the energy at the top of the valence band. As shown in FIG. 3, between the p-type GaAs layer 9 used as the base layer and each of the n-type AlGaAs layer 8 and the n-type AlGaAs layer 10 used as the emitter layer or the collector layer are provided an intrinsic (i-type) GaAs layer and a graded i-type AlGaAs layer. The Al composition of the graded i-type AlGaAs layer changes, for example, from 0.3 to 0 toward the p-type GaAs layer 9 used as the base layer. In this case, the i-type GaAs layers provided on both sides of the p-type GaAs layer 9 used as the base layer ensure that carriers generated due to the absorption of light in the p-type GaAs layer 9 used as the base layer, i.e. the photodetection layer can efficiently run on the potential slope. The graded i-type AlGaAs layers suppress potential spikes caused by discontinuities in energy band attendant to heterojunctions of the p-type GaAs layer 9 with the n-type AlGaAs layer 8 and the n-type AlGaAs layer 10.

Explained below is a method for manufacturing the optical semiconductor device shown in FIG. 2.

As shown in FIG. 2, the ridge 1a is first formed on a surface of the p-type GaAs substrate 1. After that, the p-type AlGaAs layer 2, the active layer 3 which may be, for example an, i-type GaAs layer, the n-type AlGaAs layer 4, the p-type AlGaAs layer 5, and the n-type AlGaAs layer 6 for the laser diode LD are epitaxially grown in sequence on the p-type GaAs substrate 1 by, for example, metalorganic chemical vapor deposition (MOCVD) method, and the n-type GaAs layer 7 used as the light absorbing layer is epitaxially grown on the n-type AlGaAs layer 6. After that, the n-type AlGaAs layer 8, the p-type GaAs layer 9, and the n-type AlGaAs layer 10 for the heterojunction phototransistors HPT1 and HPT2 are epitaxially grown in sequence on the n-type GaAs layer 7. In this case, the p-type AlGaAs layer 2, the active layer 3, and the n-type AlGaAs layer 4 on the ridge 1a are epitaxially grown to make a triangular prism as a whole. In case that the heterojunction phototransistors HPT1 and HPT2 are constituted as shown in FIG. 3, after a graded i-type AlGaAs layer and an i-type GaAs layer are epitaxially grown in sequence on the n-type AlGaAs layer 8, the p-type GaAs layer 9 is epitaxially grown on the i-type GaAs layer, then an i-type GaAs layer and a graded i-type AlGaAs layer are epitaxially grown in sequence on the p-type GaAs layer 9, and the n-type AlGaAs layer 10 is epitaxially grown on the graded i-type AlGaAs layer.

After that, a resist pattern (not shown) of a predetermined configuration is provided as a mask on the n-type AlGaAs layer 10 by the photolithography, and by sequentially etching off predetermined portions of the n-type AlGaAs layer 10, the p-type GaAs layer 9 and the n-type AlGaAs layer 8 by a dry etching method such as, for example, the reactive ion etching (RIE) method, the groove 11 for isolating the heterojunction phototransistor HPT1 and HPT2 is made. Thus a desired optical semiconductor device is completed.

The groove 11 for isolating the heterojunction phototransistors HPT1 and HPT2 may be provided without using a photomask by the following method.

Figure 4A:
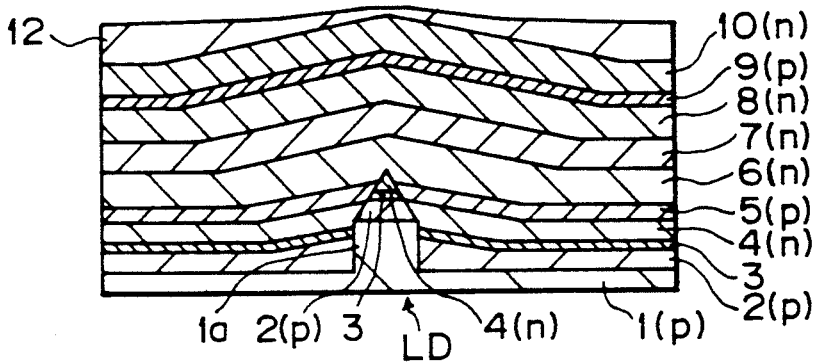
FIGS. 4A to 4C is a cross sectional view for explaining a method of making a groove for isolating the heterojunction phototransistor in the optical semiconductor device according to the first embodiment of the invention.

As shown in FIG. 4A, upon the epitaxial growth for manufacturing the optical semiconductor device, a relatively sharp apex is formed in the n-type AlGaAs layer 10 in the upper part of the laser diode LD, and a resist 12 is coated on the entire surface of the n-type AlGaAs layer 10. Then the resist 12 becomes thinner near the top of the n-type AlGaAs layer 10 than in the other part.

Figure 4B:
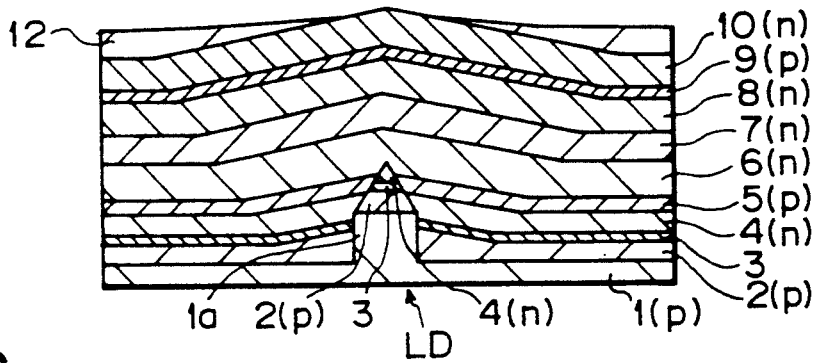

After that, the resist 12 is entirely exposed to light, then the surface layer of the resist 12 is removed by a predetermined thickness, and as shown in FIG. 4B, the apex of the n-type AlGaAs layer 10 is exposed.

Figure 4C:
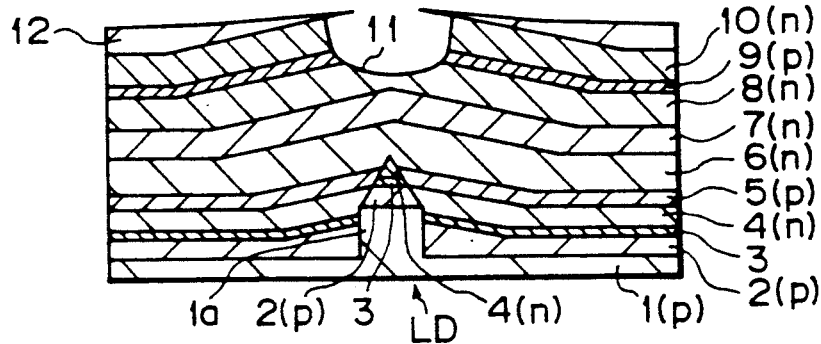

After that, by using the resist 12 as a mask, the n-type AlGaAs layer 10, the p-type GaAs layer 9, and the n-type AlGaAs layer 8 are sequentially etched by the wet etching method. As a result, the groove 11 is formed as shown in FIG. 4C without using a photomask.

In the optical semiconductor device according to the first embodiment, by using the SDH laser as the laser diode LD as described above, the following various advantages are obtained. That is, since the SDH laser has a threshold current as small as, for example, 1 to 3 mA, it is possible to reduce the operating current to a value as small as several mA which is remarkably lower than those of typical laser diodes. Therefore, the SDH laser matches very well with electronic elements such as transistors in respect of operating current, and the design of the heterojunction phototransistors HPT1 and HPT2 integrated simultaneously with the SDH laser is easy. Thus, flexibility in realizing optical semiconductor devices is high. In addition, power consumption of optical semiconductor devices can be reduced.

Moreover, the SDH laser is of an inner stripe type, and can be made by a common epitaxial growth. Therefore, as described above, all of the layers for the SDH laser and the layers for the heterojunction phototransistors HPT1 and HPT2 can be made by a common epitaxial growth, which makes the process for manufacturing optical semiconductor devices very easy.

Figure 5:
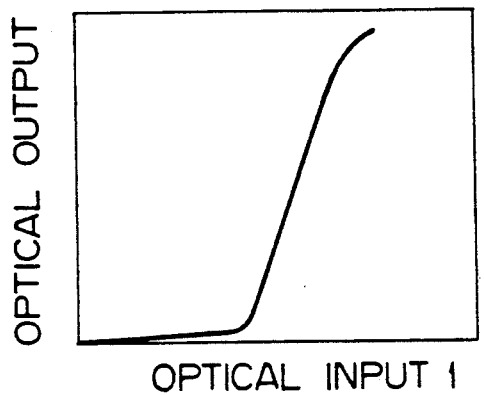
FIG. 5 is a graph illustrating an optical input and output characteristic of the optical semiconductor device according to the first embodiment of the invention.
Figure 6:
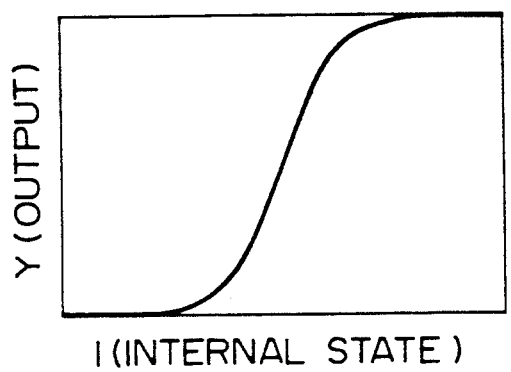
FIG. 6 is a graph illustrating a typical neuron input and output characteristic.
Figure 7:
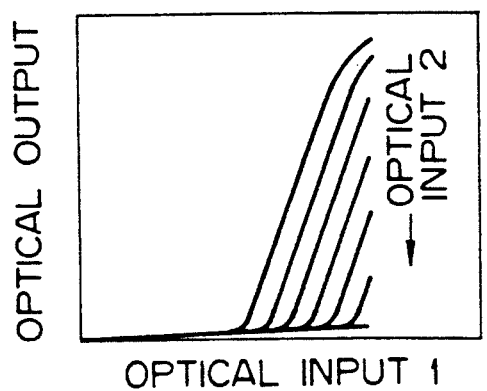
FIG. 7 is a graph illustrating an optical input and output characteristic in the case where a suppressing effect is obtained by an optical input 2 in the optical semiconductor device according to the first embodiment of the invention.

The optical semiconductor device according to the first embodiment can have an optical input and output characteristic as shown in FIG. 5 in response to the optical input 1. The optical input and output characteristic shown in FIG. 5 is analogous to a typical neuron input and output curve (Sigmoid function) as shown in FIG. 6. Moreover, a suppressing effect as shown in FIG. 7 is obtained in response to the optical input 2. Therefore, the optical semiconductor device according to the first embodiment may be used as an optical neuro element.

Further, the optical semiconductor device according to the first embodiment can be used typically as a differential optical amplifying element which is operated by a difference in signal intensity between the optical input 1 and the optical input 2. In this case, by applying an adequate bias beam of light, a linear optical amplifying element can be realized. Further, it can be employed as an optical logic element having two values above and below the threshold value, for example.

Additionally, in the optical semiconductor device according to the first embodiment, since the base layer, i.e. the photodetection layer, of the heterojunction phototransistors HPT1 and HPT2 is the p-type GaAs layer 9, and the active layer 3 of the laser diode LD is the i-type GaAs layer, the received wavelength of the heterojunction phototransistors HPT1 and HPT2 and the emitted wavelength of the laser diode LD are identical. However, by making the base layer for the heterojunction phototransistors HPT1 and HPT2 of a semiconductor material different from that of the active layer 3 for the laser diode LD, it is possible to differ the received wavelength of the heterojunction phototransistors HPT1 and HPT2 from the emitted wavelength of the laser diode LD. For example, if the base layer for the heterojunction phototransistors HPT1 and HPT2 is a GaInP layer while the active layer 3 for the laser diode LD is an i-type GaAs layer as described above, then the received wavelength of the heterojunction phototransistors HPT1 and HPT2 can be one in the range of visible light while the emitted wavelength of the laser diode LD can be one in the range of infrared rays. Thus, by differing the received wavelength of the heterojunction phototransistors HPT1 and HPT2 from the emitted wavelength of the laser diode LD, the optical semiconductor device can be used as a wavelength converting element. Optical semiconductor devices as a wavelength converting element may be employed as optical neuro element, differential optical amplifying element, optical logic element, and so on, including a wavelength converting function.

Figure 8:
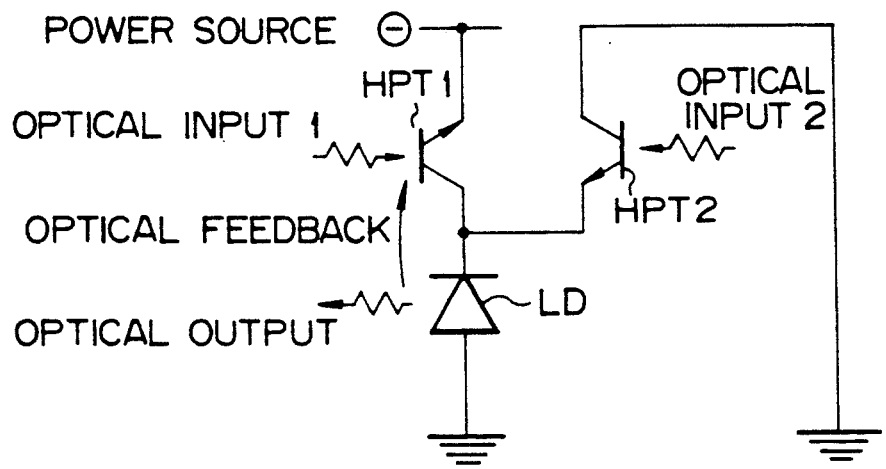
FIG. 8 is a circuit diagram illustrating an optical semiconductor device according to a second embodiment of the invention.

FIG. 8 shows an optical semiconductor device according to a second embodiment of the invention.

As shown in FIG. 8, in the optical semiconductor device according to the second embodiment, to the cathode of a laser diode LD, with its anode grounded, are connected two heterojunction phototransistors HPT1 and HPT2 in parallel and in opposite polarities with each other, to constitute a memory cell. In this case, the collector of the heterojunction phototransistor HPT1 is connected to the cathode of the laser diode LD, and the emitter is supplied with a negative voltage from a negative power source. In addition, the emitter of the heterojunction phototransistor HPT2 is connected to the cathode of the laser diode LD, and the collector is grounded. Alternatively, the collector of the heterojunction phototransistor HPT2 may be supplied with a positive voltage from a positive power source.

In this case, an optical feedback loop is produced between the laser diode LD and the heterojunction phototransistor HPT1. In contrast, the laser diode LD and the heterojunction phototransistor HPT2 are optically independent.

In the optical semiconductor device according to the second embodiment having the aforementioned structure, when the heterojunction phototransistor HPT1 is turned on by the optical input 1, a forward current above a threshold value flows in the laser diode LD, and an optical output is obtained. Part of the optical output is fed back to the heterojunction phototransistor HPT1 through the optical feedback loop to hold the heterojunction phototransistor HPT1 on even after the optical input 1 is removed. Therefore, the laser diode LD is also held on, and the optical output is maintained. These are the setting, i.e. writing, and storage operations.

When the heterojunction phototransistor HPT2 is turned on by the optical input 2, the current flows through the heterojunction phototransistors HPT1 and HPT2, which decreases the forward current flowing in the laser diode LD below the threshold current. Therefore, the laser diode LD is turned off, and the optical output is not obtained. This is resetting, i.e. erasing operation. Once the laser diode LD is turned on, the optical feedback to the heterojunction phototransistor HPT1 is removed. As a result, the heterojunction phototransistor HPT1 is turned off. Therefore, no current flows in the laser diode LD even after the optical input 2 is removed, and the optical output is held off.

As referred to above, an optical memory operation capable of setting, i.e. writing, and resetting, i.e. erasure by light is realized.

Figure 9:
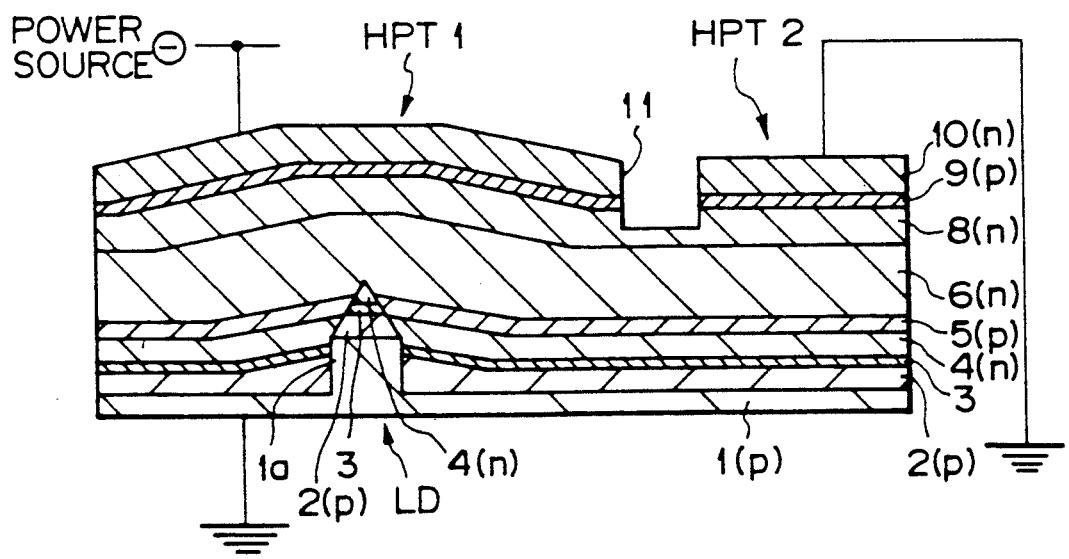
FIG. 9 is a cross sectional view illustrating an example of a structure of the optical semiconductor device according to the second embodiment of the invention.

FIG. 9 shows a specific structure for the optical semiconductor device according to the second embodiment referred to above.

As shown in FIG. 9, in the optical semiconductor device, the laser diode LD in the form of an SDH laser and the heterojunction phototransistors HPT1 and HPT2 are monolithically integrated on a p-type GaAs substrate 1.

In this case, a cavity of an SDH laser constituting the laser diode LD is made of a p-type AlGaAs layer 2 used as a p-type cladding layer which is provided on a stripe-shaped ridge 1a formed on a surface of the p-type GaAs substrate 1 and extending in one direction, an active layer 3 in the form of, for example, an i-type GaAs layer, provided on the layer 2, and an n-type AlGaAs layer 4 used as a first n-type cladding layer provided on the layer 3. Reference numeral 5 refers to a p-type AlGaAs layer used as a current block layer, and 6 to an n-type AlGaAs layer used as a second n-type cladding layer.

Formed on the n-type AlGaAs layer 6 are an n-type AlGaAs layer 8, a p-type GaAs layer 9, and an n-type AlGaAs layer 10 in sequence. In this case, a groove 11 for isolating the heterojunction phototransistors HPT1 and HPT2 is made in the n-type AlGaAs layer 8, the p-type GaAs layer 9, and the n-type AlGaAs layer 10 in a portion isolated from the current stripe portion of the laser diode LD, i.e. in a portion isolated from the portion of the ridge 1a, as viewed in the plan view. The n-type AlGaAs layer 8, the p-type GaAs layer 9, and the n-type AlGaAs layer 10 on one side of the groove 11 (the left side in FIG. 9) are used as a collector layer, a base layer, and an emitter layer to make the heterojunction phototransistor HPT1. The n-type AlGaAs layer 8, the p-type GaAs layer 9, and the n-type AlGaAs layer 10 on the other side of the groove 11 (the right side in FIG. 9) are used as an emitter layer, a base layer, and a collector layer to make the heterojunction phototransistor HPT2. By this structure in which the heterojunction phototransistors HPT1 and HPT2 are provided on the laser diode LD, parallel division of the photodetection portion is realized very easily.

In this case, the heterojunction phototransistor HPT1 is stacked directly on the laser diode LD. As a result, an optical feedback loop is produced between the laser diode LD and the heterojunction phototransistor HPT1. In contrast, the heterojunction phototransistor HPT2 is isolated by a sufficient distance from the laser diode LD as viewed in the plan view. Therefore, the laser diode LD and the heterojunction phototransistor HPT2 are optically independent.

The heterojunction phototransistors HPT1 and HPT2 shown in FIG. 9 are preferably constituted so that the n-type AlGaAs layer 8 and the n-type AlGaAs layer 10 used as the emitter layer or the collector layer are in absolute symmetry about the p-type GaAs layer 9 used as the base layer both in energy gap and in carrier concentration. By employing the symmetric structure of the heterojunction phototransistors HPT1 and HPT2 about the base layer, the following advantage is obtained. That is, since the heterojunction phototransistor HPT1 for on-input and the heterojunction phototransistor HPT2 for off-input are opposite in the emitter and the collector, in order to design the heterojunction phototransistors HPT1 and HPT2 independently, it is ideal to make the emitter layer, the base layer and the collector layer for the heterojunction phototransistor HPT1 separately from the emitter layer, the base layer and the collector layer for the heterojunction phototransistor HPT2. Nevertheless, by employing the symmetric structure of the heterojunction phototransistors HPT1 and HPT2 about the base layer, absolutely the same characteristic is obtained even by oppositely using the emitters and collectors in the heterojunction phototransistors HPT1 and HPT2, which makes it possible to make the heterojunction phototransistors HPT1 and HPT2 without paying attention to their polarities. As a result, entire design of the element and the process for making the element are very easy.

The heterojunction phototransistors HPT1 and HPT2 are preferably constituted, for example, as shown in FIG. 3, similarly to the first embodiment. As shown in FIG. 3, between the p-type GaAs layer 9 used as the base layer and each of the n-type AlGaAs layer 8 and the n-type AlGaAs layer 10 used as the emitter layer or the collector layer are provided an i-type GaAs layer and a graded i-type AlGaAs layer. The Al composition of the graded i-type AlGaAs layer changes, for example, from 0.3 to 0 toward the p-type GaAs layer 9 used as the base layer. In this case, the i-type GaAs layers provided on both sides of the p-type GaAs layer 9 used as the base layer to ensures that carriers generated due to the absorption of light in the p-type GaAs layer 9 used as the base layer, i.e. the photodetection layer can efficiently run on the potential slope. The graded i-type AlGaAs layers suppress potential spikes caused by discontinuities in energy band attendant to heterojunctions of the p-type GaAs layer 9 with the n-type AlGaAs layer 8 and the n-type AlGaAs layer 10.

Explained below is a method for manufacturing the optical semiconductor device shown in FIG. 9.

As shown in FIG. 9, the ridge 1a is first provided on a surface of the p-type GaAs substrate 1. After that, the p-type AlGaAs layer 2, the active layer 3 which may be, for example, an i-type GaAs layer, the n-type AlGaAs layer 4, the p-type AlGaAs layer 5, and the n-type AlGaAs layer 6 for the laser diode LD are epitaxially grown in sequence on the p-type GaAs substrate I by, for example, the MOCVD method. After that, the n-type AlGaAs layer 8, the p-type GaAs layer 9, and the n-type AlGaAs layer 10 for the heterojunction phototransistors HPT1 and HPT2 are epitaxially grown in sequence on the n-type AlGaAs layer 6. In this case, the p-type AlGaAs layer 2, the active layer 3, and the n-type AlGaAs layer 4 on the ridge 1a are epitaxially grown to make a triangular prism as a whole. In case that the heterojunction phototransistors HPT1 and HPT2 are constituted as shown in FIG. 3, after a graded i-type AlGaAs layer and an i-type GaAs layer are epitaxially grown in sequence on the n-type AlGaAs layer 8, the p-type GaAs layer 9 is epitaxially grown on the i-type GaAs layer, then an i-type GaAs layer and a graded i-type AlGaAs layer are epitaxially grown in sequence on the p-type GaAs layer 9, and the n-type AlGaAs layer 10 is epitaxially grown on the graded i-type AlGaAs layer.

After that, a resist pattern (not shown) of a predetermined configuration is provided as a mask on the n-type AlGaAs layer 10 by the lithography, and by sequentially etching off predetermined portions of the n-type AlGaAs layer 10, the p-type GaAs layer 9 and the n-type AlGaAs layer 8 by a dry etching method such as, for example, the RIE method, the groove 11 for isolating the heterojunction phototransistors HPT1 and HPT2 is made. Thus a desired optical semiconductor device is completed.

In the optical semiconductor device according to the second embodiment, similarly to the first embodiment, by using the SDH laser as the laser diode LD as described above, the following various advantages are obtained. That is, since the SDH laser has a threshold current as small as, for example, 1 to 3 mA, it is possible to reduce the operating current to a value as small as several mA which is remarkably lower than those of typical laser diodes. Therefore, the SDH laser matches very well with electronic elements such as transistors in respect of operating current, and the design of the heterojunction phototransistors HPT1 and HPT2 integrated simultaneously with the SDH laser is easy. Thus, flexibility in realizing optical semiconductor devices is high. In addition, power consumption of optical semiconductor devices can be reduced.

Moreover, the SDH laser is of an inner stripe type, and can be made by a common epitaxial growth. Therefore, as described above, all of the layers for the SDH laser and the layers for the heterojunction phototransistors HPT1 and HPT2 can be made by a common epitaxial growth, which makes the process for manufacturing optical semiconductor devices very easy.

Additionally, in the optical semiconductor device according to the second embodiment, since the base layer, i.e. the photodetection layer, of the heterojunction phototransistors HPT1 and HPT2 is the p-type GaAs layer 9, and the active layer 3 of the laser diode LD is the i-type GaAs layer, the received wavelength of the heterojunction phototransistors HPT1 and HPT2 and the emitted wavelength of the laser diode LD are identical. However, by making the base layer for the heterojunction phototransistors HPT1 and HPT2 of a semiconductor material different from that of the active layer 3 for the laser diode LD, it is possible to differ the received wavelength of the heterojunction phototransistors HPT1 and HPT2 from the emitted wavelength of the laser diode LD. For example, if the base layer for the heterojunction phototransistors HPT1 and HPT2 is a GaInP layer while the active layer 3 for the laser diode LD is an i-type GaAs layer as described above, then the received wavelength of the heterojunction phototransistors HPT1 and HPT2 can be one in the range of visible light while the emitted wavelength of the laser diode LD can be one in the range of infrared rays. Thus, by differing the received wavelength of the heterojunction phototransistors HPT1 and HPT2 from the emitted wavelength of the laser diode LD, it is possible to realize an optical memory having a wavelength converting function.

Figure 10:
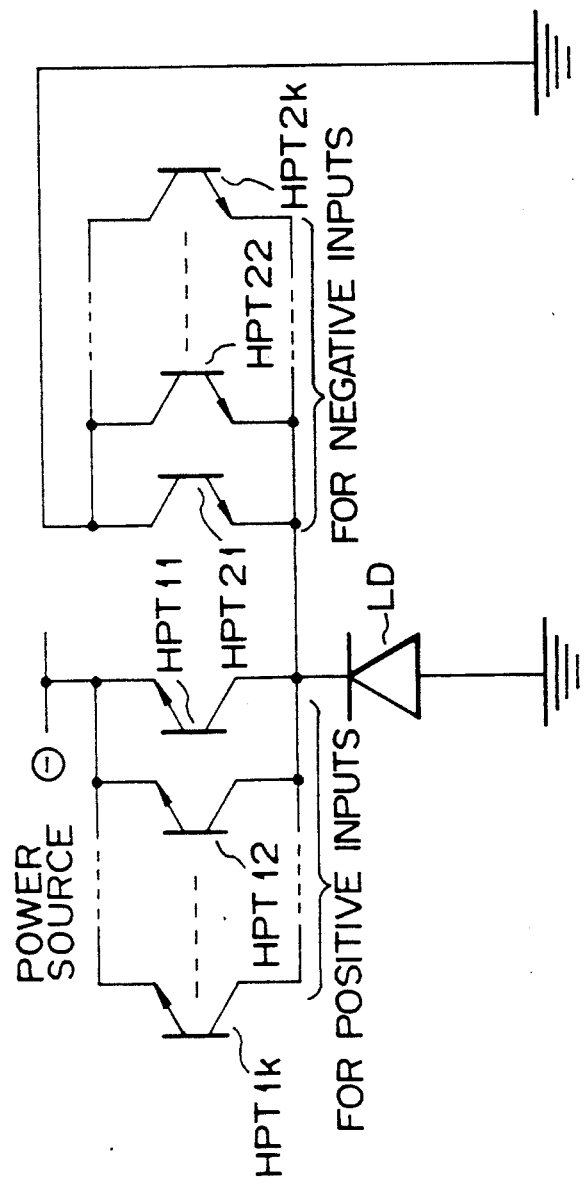
FIG. 10 is a circuit diagram illustrating an optical semiconductor device according to a third embodiment of the invention.

FIG. 10 shows an optical semiconductor device according to a third embodiment of the invention.

As shown in FIG. 10, in the optical semiconductor device according to the third embodiment, k (k≧2) heterojunction phototransistors HPT11 to for positive input connected in parallel and k heterojunction phototransistors HPT21 to 2k for negative input connected in parallel are connected in parallel with each other to the cathode of the laser diode LD. That is, while the optical semiconductor device according to the first embodiment includes one positive input and one negative input, the optical semiconductor device according to the third embodiment has k positive inputs and k negative inputs.

The optical semiconductor device according to the third embodiment operates in the same manner as the optical semiconductor device according to the first embodiment except that the optical inputs are plural.

In a specific configuration for the optical semiconductor device according to the third embodiment, k heterojunction phototransistors isolated by the groove 11 may be formed in lieu of the heterojunction phototransistors HPT1 and HPT2 in the structure of, for example, FIG. 2.

Figure 11:
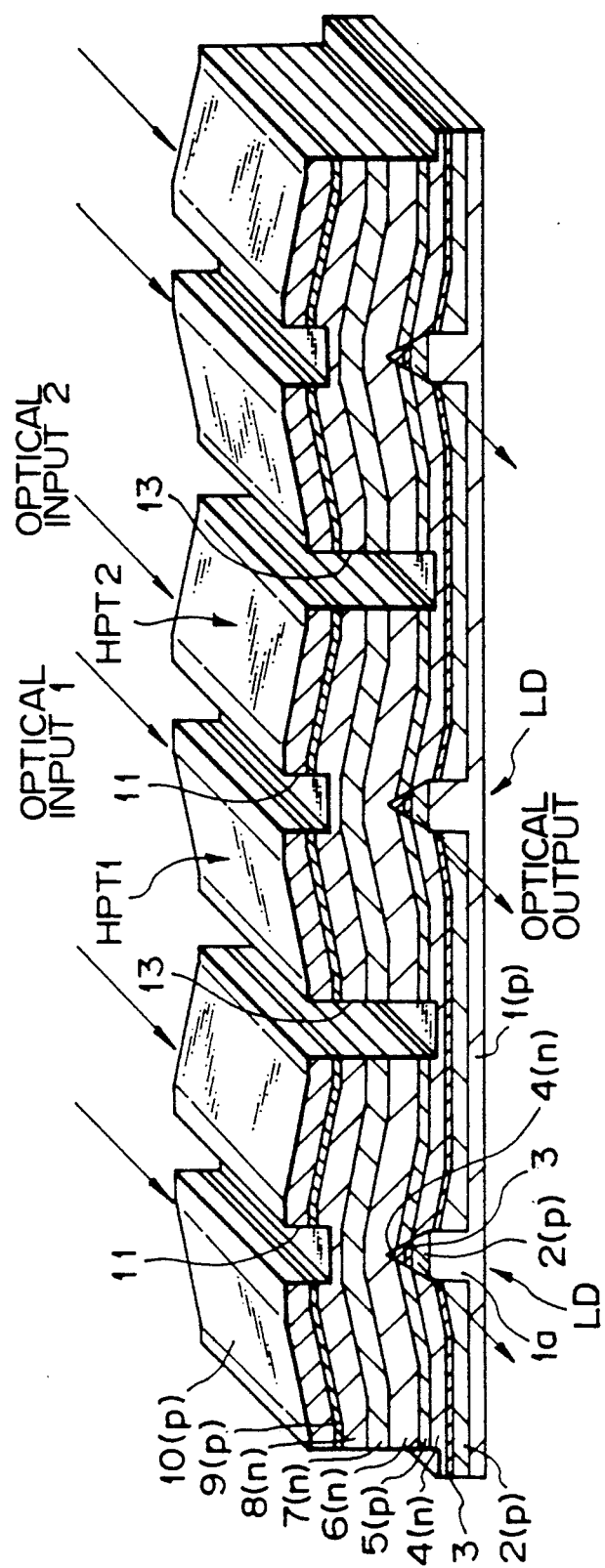
FIG. 11 is a perspective view illustrating an optical semiconductor device according to a fourth embodiment of the invention.

FIG. 11 shows an optical semiconductor device according to a fourth embodiment of the invention.

As shown in FIG. 11, in the optical semiconductor device according to the fourth embodiment, optical semiconductor devices each having the same structure as that of FIG. 2 are integrated in a one-dimensional array on the p-type GaAs substrate 1. Each of the optical semiconductor devices integrated in the one-dimensional array are isolated by a groove 13 extending to the n-type AlGaAs layer 4.

In this case, a plurality of such one-dimensional arrays of the optical semiconductor devices are provided in parallel.

In the optical semiconductor device according to the fourth embodiment, optical inputs are introduced from end surfaces of heterojunction phototransistors HPT1 and HPT2 of the respective optical semiconductor devices aligned in the one dimensional array as shown in FIG. 11, and optical outputs are obtained from the laser diodes LD in response to the optical inputs. The optical outputs are then used as optical inputs to optical semiconductor devices in the subsequent one-dimensional array. In this fashion, cascade connection of one-dimensional arrays of optical semiconductor devices is possible.

Since the optical semiconductor device according to the fourth embodiment uses an SDH laser of a low operating current as the laser diode LD of each of the optical semiconductor device, power consumption is sufficiently low regardless of the integrated arrangement.

Additionally, the optical semiconductor device according to the fourth embodiment can be realized in a very simple structure in which the optical semiconductor devices shown in FIG. 2 are aligned in one-dimensional arrays and isolated by the groove 13. Also, the optical semiconductor device can be manufactured in the same very easy process as that explained with reference to the first embodiment.

As referred to above, the optical semiconductor device shown in FIG. 2 satisfies desired requirements for integration in respect of the power consumption and the manufacturing process. With this structure, however, the optical inputs normally introduced to the heterojunction phototransistors HPT1 and HPT2 from a direction normal to the surface of the substrate, which means that the optical output is obtained from the end surface of the laser diode LD, and the optical input direction and the optical output direction deviate by 90 degrees. It is therefore not suitable for cascade connection. Cascade connection would be possible if the optical input is introduced from the end surfaces of the heterojunction phototransistors HPT1 and HPT2 as shown in FIG. 11. However, alignment of the input light is not always easy. Moreover, this method can realize one dimensional arrays alone, and it is difficult for realize two-dimensional arrays. Embodiments for solving this problem are therefore explained below with reference to FIGS. 12 to 16.

Figure 12:
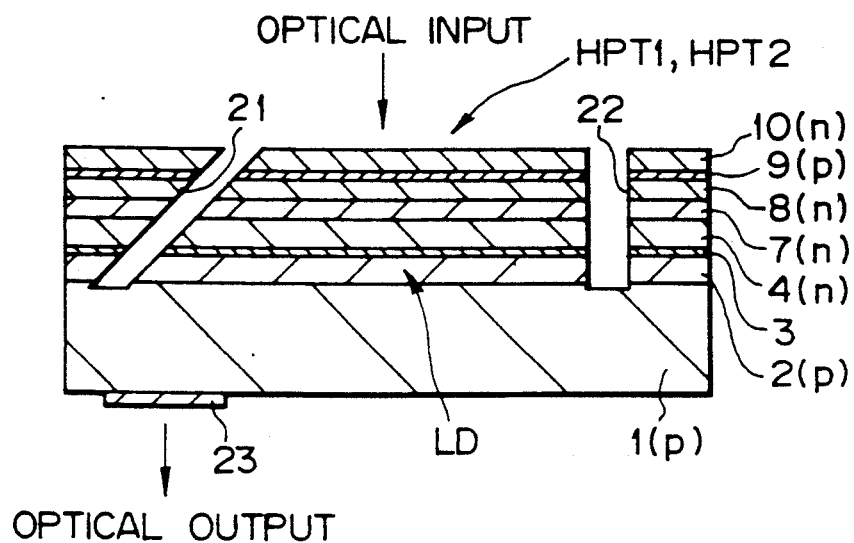
FIG. 12 is a cross sectional view of an optical semiconductor device according to a fifth embodiment of the invention.

FIG. 12 shows an optical semiconductor device according to a fifth embodiment of the invention. It is a cross sectional view taken along the waveguide direction (cavity length direction) of the laser diode.

As shown in FIG. 12, in the optical semiconductor device according to the fifth embodiment, a groove 21 angled by 45 degrees from the substrate surface and a groove 22 normal to the substrate surface extend to the p-type GaAs substrate 1. The p-type AlGaAs layer 2, the active layer 3, and the n-type AlGaAs layer 4 between the grooves 21 and 22 constitute the laser diode LD in the form of a slab type waveguide structure having a 45-degrees reflection-type turn-up cavity structure. In this case, an optical output is taken out at a lower position of FIG. 12 by a 45-degrees reflective wall defined by an end surface of the groove 21 of the laser diode LD. At a portion on the back surface of the p-type GaAs substrate 1 where the optical output is taken out, a Bragg reflector (also called DBR) 23 in the form of, for example, a semiconductor multi-layered film, is provided. In this case, since the optical output is taken out through the p-type GaAs substrate 1, the active layer 3 of the laser diode LD is made by, for example, an InGaAs layer, in order to obtain an optical output for which the p-type GaAs substrate 1 is transparent.

The grooves 21 and 22 can be made easily by a dry etching method such as, for example, the RIE method.

Figure 13:
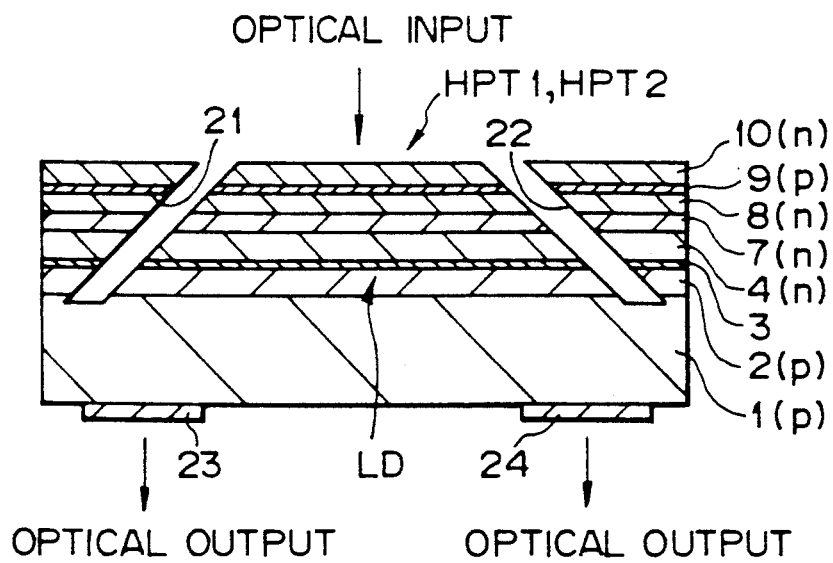
FIG. 13 is a cross sectional view of an optical semiconductor device according to a sixth embodiment of the invention.

FIG. 13 shows an optical semiconductor device according to a sixth embodiment of the invention.

As shown in FIG. 13, in the optical semiconductor device according to the sixth embodiment, not only the groove 21 but also the groove 22 is angled by 45 degrees from the substrate surface so that both end surfaces of the laser diode LD behave as 45 degrees reflective walls. By the 45-degrees reflective walls defined by the end surfaces of the laser diode LD, two equivalent optical outputs are taken out in lower positions of FIG. 13. In this case, another Bragg reflector 24 is provided on the back surface of the p-type GaAs substrate 1 at a position where the optical output reflected by the 45-degrees reflective wall defined by the end surface of the groove 22 of the laser diode LD is taken out.

Figure 14:
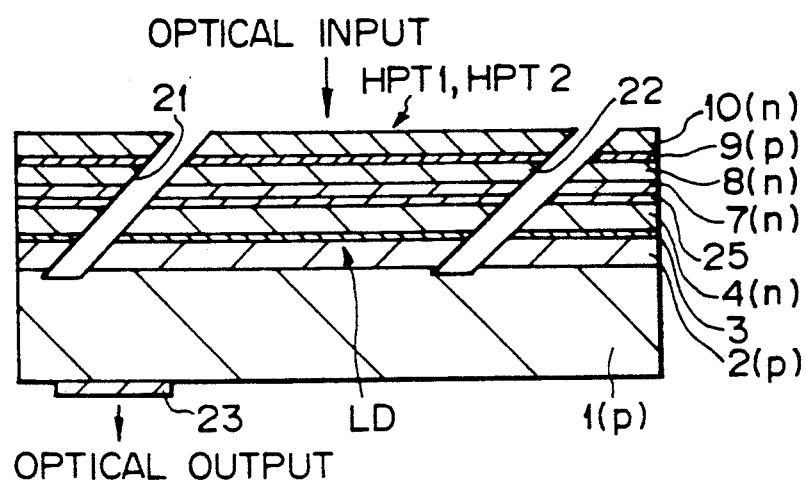
FIG. 14 is a cross sectional view of an optical semiconductor device according to a seventh embodiment of the invention.

FIG. 14 shows an optical semiconductor device according to a seventh embodiment of the invention.

As shown in FIG. 14, in the optical semiconductor device according to the seventh embodiment, grooves 21 and 22 are angled by 45 degrees from the substrate surface and extend in parallel with each other. Provided between the n-type AlGaAs layer 4 and the n-type GaAs layer 7 used as the light absorbing layer is a Bragg reflector 25. By the 45-degrees reflective wall defined by the end surface of the groove 21 of the laser diode LD, an optical output is taken out at a lower position of FIG. 14. The optical output by the 45-degrees reflective wall defined by the end surface of the groove 22 is prevented from coming out to an upper position in FIG. 14 by the presence of the Bragg reflector 25 and the n-type GaAs layer 7 used as the light absorbing layer. Therefore, the optical output in this embodiment is equivalent to the optical output by the optical semiconductor device according to the fifth embodiment shown in FIG. 12.

In the fifth and sixth embodiments, since the grooves 21 and 22 are not parallel, dry etching for making the grooves 21 and 22 must be done twice. In the seventh embodiment, however, since the grooves 21 and 22 are parallel, dry etching for making the grooves 21 and 22 may be once.

Figure 15:
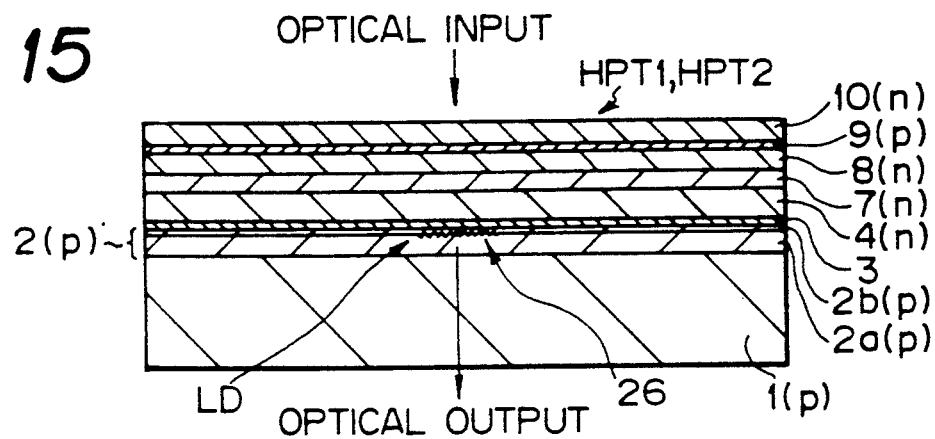
FIG. 15 is a cross sectional view of an optical semiconductor device according to an eighth embodiment of the invention.
Figure 16:
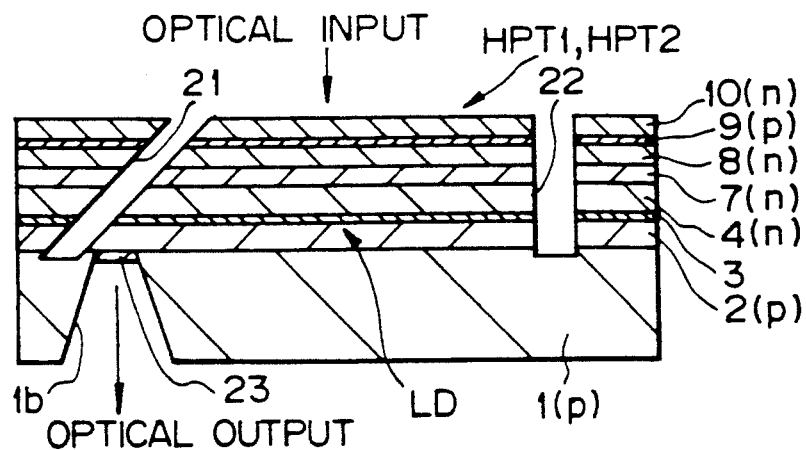
FIG. 16 is a cross sectional view of an optical semiconductor device according to a ninth embodiment of the invention.

FIG. 15 shows an optical semiconductor device according to an eighth embodiment of the invention.

As shown in FIG. 15, in the optical semiconductor device according to the eighth embodiment, a diffraction grating 26 is locally provided in the p-type AlGaAs layer 2 used as the p-type cladding layer of the laser diode LD. In order to make the diffraction grating 26 in the p-type AlGaAs layer 2, after a p-type AlGaAs layer 2a is first epitaxially grown, the epitaxial growth is once interrupted to make the diffraction grating 26 on the surface of the p-type AlGaAs layer 2a by etching. After that, a p-type AlGaAs layer 2b is epitaxially grown.

In the optical semiconductor device according to the eighth embodiment, a laser beam is scattered in vertical directions with respect to the p-type AlGaAs layer 2 in the portion of the diffraction grating 26 provided in the p-type AlGaAs layer 2 used as a waveguide, and an optical output is taken out in a lower position of FIG. 15.

In the optical semiconductor devices according to the fifth, sixth, seventh and eighth embodiments, the optical output is taken out at the bottom, that is, from the back surface of the substrate, through the p-type GaAs substrate 1. Therefore, the emitted wavelength of the laser diode LD must be a value for which the p-type GaAs substrate is transparent. For this purpose, the active layer 3 of the laser diode LD must be made by an InGaAs layer, for example, and not by a GaAs layer. However, in an optical semiconductor device according to a ninth embodiment of the invention shown in FIG. 16 in which a hole 1b is made in the p-type GaAs substrate 1 by etching so as to take out the optical output from the hole 1b, the emitted wavelength of the laser diode LD need not be a value for which the p-type GaAs substrate 1 is transparent, and the active layer 3 of the laser diode LD may be an i-type GaAs layer. In this case, a Bragg reflector 23 is provided on the back surface of the p-type AlGaAs layer 2 in the location of the hole 1b.

The ninth embodiment corresponds to one in which the hole 1b is made in the p-type GaAs substrate 1 in the optical semiconductor device according to the fifth embodiment shown in FIG. 12. The same hole 1b may be provided in the p-type GaAs substrate 1 in each of the optical semiconductor devices according to the sixth, seventh and eighth embodiments.

In each of the optical semiconductor devices according to the fifth, sixth, seventh, eighth and ninth embodiments, a micro lens can be provided directly on the optical output end surface. Since the surface for providing the micro lens is desired to be planar, for providing the micro lens directly on the optical output end surface, the structures without the hole 1b in the p-type GaAs substrate 1 as the fifth, sixth, seventh and eighth embodiments are recommended rather than the structure with the hole 1b in the p-type GaAs substrate 1 as the ninth embodiment.

Since each of the optical semiconductor devices according to the foregoing fifth, sixth, seventh, eighth and ninth embodiments makes optical input from its front surface and optical output from its back surface possible, not only one dimensional array of optical semiconductor devices but also two dimensional array of optical semiconductor devices is readily realized. Cascade connection of optical semiconductor devices is also readily attained.

In the optical semiconductor device using an SDH laser as its laser diode LD as shown in FIG. 2, if the SDH laser is made in the form of a 45-degrees reflection-type turn-up cavity structure as it was for the laser diode LD in the optical semiconductor device according to the fifth, sixth or seventh embodiment, then the optical semiconductor device can be manufactured in a very easy process. That is, after the layers for making the laser diode LD, the n-type GaAs layer 7 used as the light absorbing layer, and the layers for making the heterojunction phototransistors HPT1 and HPT2 are grown by a common epitaxial growth, the groove 11 for isolating the heterojunction phototransistors HPT1 and HPT2 is made, followed by making the 45-degrees reflective wall of the cavity of the laser diode LD and by isolation of elements. By these steps alone, one dimensional arrays or two dimensional arrays of optical semiconductor devices can be realized.

Figure 17:
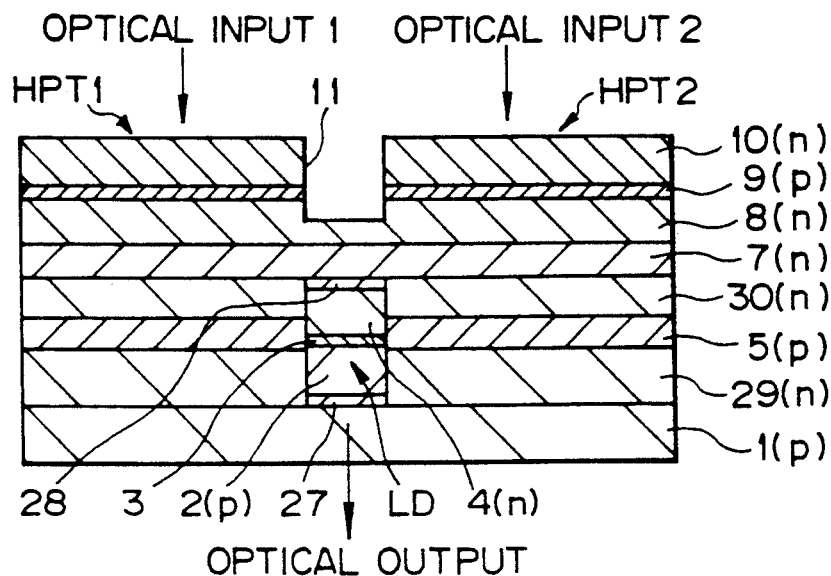
FIG. 17 is a cross sectional view of an optical semiconductor device according to a tenth embodiment of the invention.

FIG. 17 shows an optical semiconductor device according to a tenth embodiment of the invention.

As shown in FIG. 17, in the optical semiconductor device according to the tenth embodiment, used as the laser diode LD is a so-called vertical cavity type surface emitting laser in the form of a cavity in which Bragg reflectors 27 and 28 are provided on and under the p-type AlGaAs layer 2, the active layer 3 and the n-type AlGaAs layer 4 which make a cylindrical configuration as a whole. The optical output is taken out from the lower position in FIG. 17. Vertical cavity type surface emitting lasers are described in, for example, Technical Digest of Third Optoelectronics Conference, 13B1-1, 196(1990), Technical Digest of Third Optoelectronics Conference, 13B1-3, 200(1990), and Technical Digest of Third Optoelectronics Conference, 13B1-4, 202(1990).

The tenth embodiment has advantages that the laser diode LD need not be a 45-degrees reflection-type turn-up cavity structure unlike the fifth, sixth, seventh, eighth and ninth embodiments and that the diffraction grating 26 need not be provided. Also, the optical semiconductor device according to the tenth embodiment makes optical input from its front surface and optical output from its back surface possible, and can significantly reduces the threshold current, hence the operating current, of the surface emitting laser used as the laser diode LD in dependence of its design. Therefore, the tenth embodiment is suitable for two dimensional arrays of optical semiconductor devices. Moreover, since the surface emitting laser, which is low in operating current similarly to an SDH laser, matches very well with electronic elements such as transistors in respect of operating current, design of heterojunction phototransistors HPT1 and HPT2 integrated simultaneously with the laser diode LD is easy, and flexibility in realization of optical semiconductor devices is increased.

Figure 18:
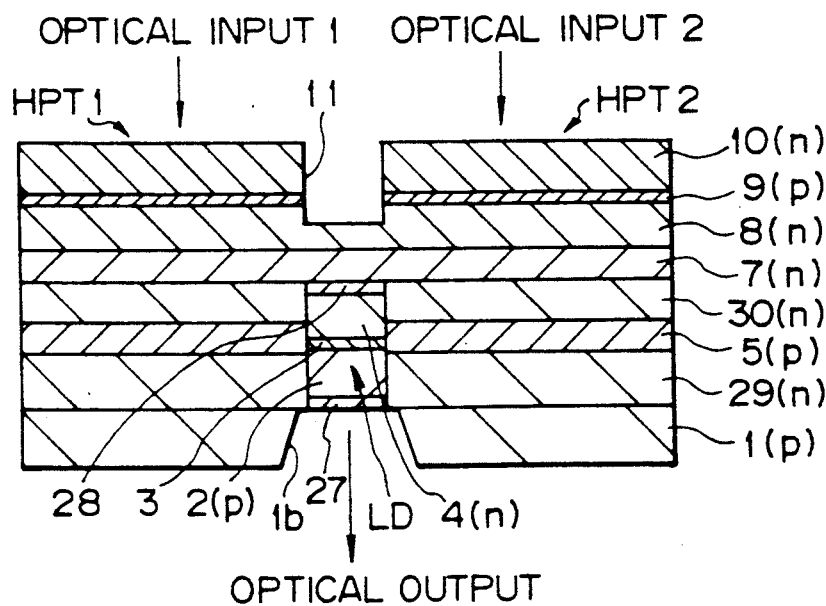
FIG. 18 is a cross sectional view of an optical semiconductor device according to an eleventh embodiment of the invention.

FIG. 18 shows an optical semiconductor device according to an eleventh embodiment of the invention.

As shown in FIG. 18, the optical semiconductor device according to the eleventh embodiment corresponds to one having the hole 1b in the p-type GaAs substrate 1 at the optical output end in the optical semiconductor device according to the tenth embodiment, and takes out the optical output from the hole 1b.

According to the eleventh embodiment, similarly to the ninth embodiment, since the emitted wavelength of the laser diode LD need not be a value for which the p-type GaAs substrate 1 is transparent, the active layer 3 of the laser diode LD may be made by an i-type GaAs layer.

In both of the optical semiconductor devices according to the tenth and eleventh embodiments, a micro lens can be provided directly on the optical output end surface.

In the optical semiconductor device shown in FIG. 1, load resistor in the order of, for example, several decade ohm, is normally provided between the negative power source and the heterojunction phototransistor HPT1. That is, in an optical semiconductor device according to a twelfth embodiment of the invention, load resistor R is provided between the negative power source and the heterojunction phototransistor HPT1. The load resistor R may be provided outside the optical semiconductor device. In the following thirteenth embodiment, however, it can be made monolithically on the optical semiconductor device.

Figure 20:
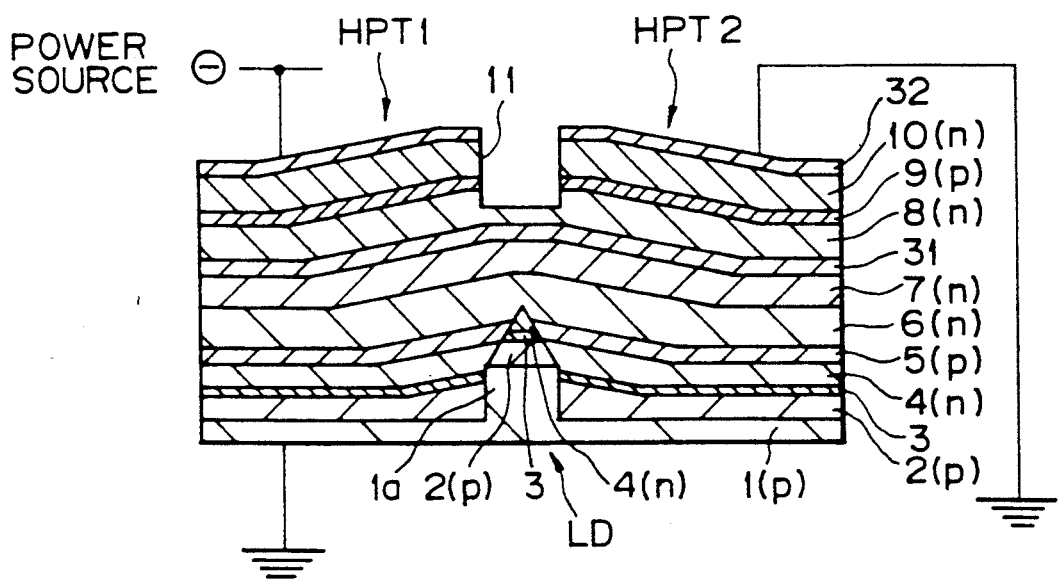
FIG. 20 is a cross sectional view illustrating a structure of an optical semiconductor device according to a thirteenth embodiment of the invention and FIG. 21 is a cross sectional view illustrating an optical semiconductor device according to a fourteenth embodiment of the invention.

FIG. 20 shows the optical semiconductor device according to the thirteenth embodiment.

As shown in FIG. 20, in the optical semiconductor device according to the thirteenth embodiment, Bragg reflectors 31 and 32 are provided on and under the n-type AlGaAs layer 8, the p-type GaAs layer 9 and the n-type AlGaAs layer 10 constituting the heterojunction phototransistors HPT1 and HPT2. These Brag reflectors 31 and 32 are made of a semiconductor multi-layered film in which, for example, AlAs layers and AlGaAs layers are stacked alternately. The remainder part of the structure is the same as that of the optical semiconductor device shown in FIG. 2.

In this case, a cavity is made by the structure in which the Bragg reflectors 31 and 32 are provided on and under the n-type AlGaAs layer 8, the p-type GaAs layer 9 and the n-type AlGaAs layer 10 constituting the heterojunction phototransistors HPT1 and HPT2. The thicknesses of the n-type AlGaAs layer 8, the p-type GaAs layer 9 and the n-type AlGaAs layer 10 are determined so that the loop of an optical stationary wave produced in the cavity by the incidence of light to the heterojunction phototransistors HPT1 and HPT2 are located at the p-type GaAs layer 9 used as the photodetection layer. More specifically, the total thickness of these n-type AlGaAs layer 8, p-type GaAs layer 9 and n-type AlGaAs layer 10, that is, the cavity length, is selected to be $(n+1)/2$ ($n=1, 2, ...$) times the optical input wavelength. Thus the loop of the optical stationary wave produced in the cavity in response to the incidence of light can be located at the p-type GaAs layer 9. In this case, at least the Bragg reflector 32 at the light incidence side is preferably designed to have a small reflectance to ensure efficient introduction of the incident light.

Because of the foregoing structure in which the loop of the optical stationary wave produced in the cavity in response to the incidence of light to the heterojunction phototransistors HPT1 and HPT2 are located at the p-type GaAs layer 9, a sufficiently high quantum efficiency (photon-carrier converting efficiency), that is, a sufficiently high optical gain, is obtained even when the thickness of the p-type GaAs layer 9 used as the photodetection layer is significantly small.

Moreover, when the base layer, that is, the photodetection layer, of the heterojunction phototransistors HPT1 and HPT2 is made by, for example, an InGaAs layer in lieu of the p-type GaAs layer, it is very effective that the loop of the optical stationary wave produced in the cavity in response to the incidence of light to the heterojunction phototransistors HPT1 and HPT2 are located at the photodetection layer. In other words, since InGaAs represents lattice mismatching with AlGaAs, in order for the InGaAs layer used as the photodetection layer to epitaxially grow on the n-type AlGaAs layer 8 used as the collector layer or the emitter layer of the heterojunction phototransistors HPT1 and HPT2, the thickness of the InGaAs layer must be within the critical thickness. However, since the critical thickness is as very small as 10 to 20 nm, if the InGaAs layer is simply used as the photodetection layer, sufficient quantum efficiency, i.e. sufficiently high optical gain, is not obtained. In spite of the very small thickness of the InGaAs layer used as the photodetection layer, by locating at the InGaAs layer such loop of the optical stationary wave produced in the cavity in response to the incidence of light to the heterojunction phototransistors HPT1 and HPT2, sufficient quantum efficiency, i.e. a sufficiently high optical gain, is obtained.

In the optical semiconductor device according to the thirteenth embodiment, steepness of variation in composition at the hetero interface between the Bragg reflector 32 and the n-type AlGaAs layer 10 is adjusted so that the load resistor R of a desired resistance value is made by the Bragg reflector 32 on the n-type AlGaAs layer 10 used as the emitter layer of the heterojunction phototransistor HPT1. That is, in this case, the load resistor R exists in the Bragg reflector 32 itself in an absolutely monolithic structure in the optical semiconductor device.

In contrast, as to the Bragg reflector 31 between the n-type GaAs layer 7 used as the light absorbing layer and the n-type AlGaAs layer 8, the resistance is lowered as long as possible by, for example, using a graded structure for the hereto interface between the Bragg reflector 31 and the n-type AlGaAs layer 8.

Figure 19:
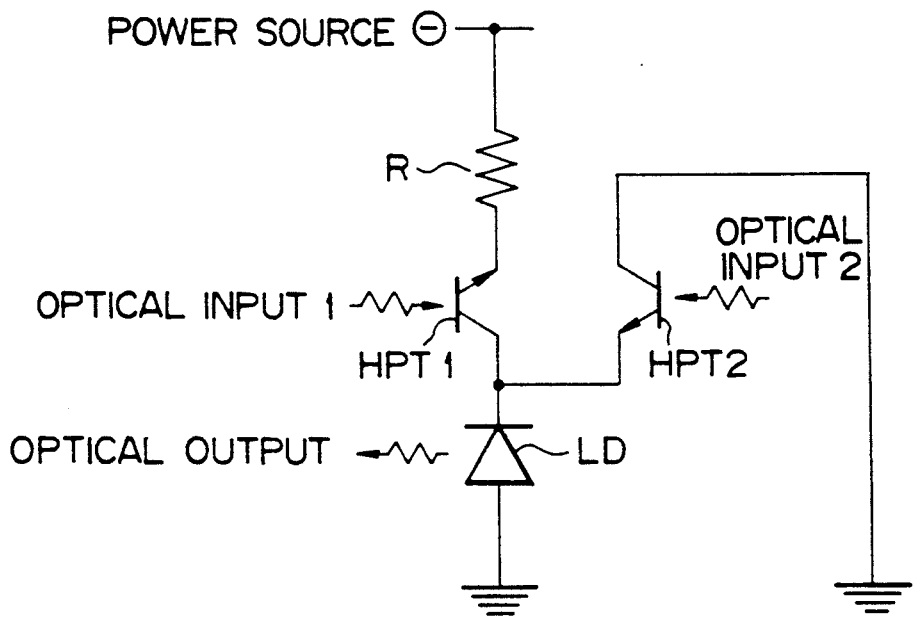
FIG. 19 is a circuit diagram of an optical semiconductor device according to twelfth embodiment of the invention.
Figure 21:
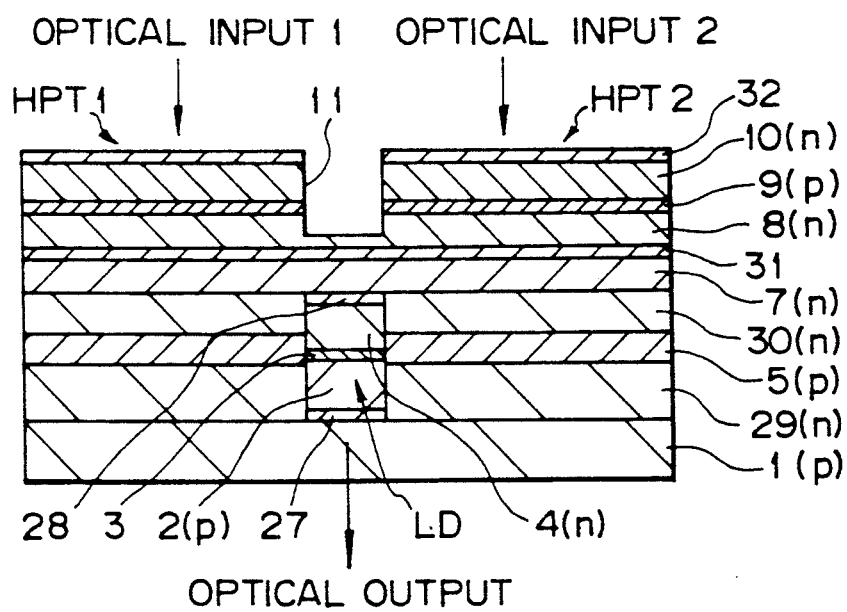

FIG. 21 shows an optical semiconductor device according to a fourteenth embodiment of the invention. An equivalent circuit of the optical semiconductor device according to the fourteenth embodiment is shown in FIG. 19.

As shown in FIG. 21, the optical semiconductor device according to the fourteenth embodiment has a structure in which a cavity is made by providing Bragg reflectors 31 and 32 on and under the heterojunction phototransistors HPT1 and HPT2 in the optical semiconductor device according to the tenth embodiment shown in FIG. 17 and in which the load resistor R is included in the Bragg reflector 32 on the n-type AlGaAs layer 10 of the heterojunction phototransistor HPT1. The load resistor R can be made by the method explained with reference to the thirteenth embodiment.

According to the fourteenth embodiment, the same advantages as those of the thirteenth embodiment are obtained in the optical semiconductor device using a vertical cavity type surface emitting laser as its laser diode LD.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, the third to fourteenth embodiments can of course be applied to the optical memory according to the second embodiment, and the order of stacking of the laser diode LD and the heterojunction phototransistors HPT1 and HPT2 may be contrary. That is, the laser diode LD may be stacked on the heterojunction phototransistors HPT1 and HPT2 via the light absorbing layer.

The laser diode LD and the heterojunction phototransistors HPT1 and HPT2 can be made of a semiconductor hetero structure other than AlGaAs/GaAs. As the laser diode LD, an SAN (Self-Aligned Narrow Stripe) laser, for example, may be used. A light emitting diode may be used in lieu of the laser diode LD.

What is claimed is:

1. An optical semiconductor device, comprising:
   a light emitting element;
   a first phototransistor; and
   a second phototransistor;
   said first and second phototransistors being connected in parallel to each other and connected to one end of said light emitting element.

2. The optical semiconductor device according to claim 1 wherein a light absorbing layer is interposed between said light emitting element and said first and second phototransistors.

3. The optical semiconductor device according to claim 1 wherein one of said first and second phototransistors cooperates with said light emitting element to make an optical feedback loop, and the other of said first and second phototransistors is optically independent of said light emitting element.

4. An optical semiconductor device comprising:
   a light emitting element;
   a first phototransistor; and
   a second phototransistor,
   said light emitting element and at least one of said first and second phototransistors being stacked, and
   said first and second phototransistors being connected in parallel with each other to one end of said light emitting element.

5. The optical semiconductor device according to claim 4 wherein a light absorbing layer is interposed between said light emitting element and said first and second phototransistors.

6. The optical semiconductor device according to claim 4 wherein said light emitting element and said one of said first and second phototransistors cooperates to make an optical feedback loop, and the other of said first and second phototransistors is optically independent of said light emitting element.

7. The optical semiconductor device according to claim 4 wherein a plurality of said semiconductor devices are integrated.

8. The optical semiconductor device according to claim 4 wherein on at least one side of end surfaces of said light emitting element a reflective surface for taking out an output beam of light in a direction normal to a substrate surface.

9. The optical semiconductor device according to claim 8 wherein a layer in the form of a multi-layered semiconductor film is interposed between said light emitting element and said first and second phototransistors.

10. The optical semiconductor device according to claim 4 wherein a diffraction grating is locally provided in a waveguide of said light emitting element.

11. The optical semiconductor device according to claim 4 wherein said light emitting element is of a vertical cavity type.

12. The optical semiconductor device according to claim 8 wherein a light exit window is provided in an optical output portion of a substrate of said optical semiconductor device.

13. The optical semiconductor device according to claim 4 wherein a layer in the form of a multi-layered semiconductor film is provided on and under said first and second phototransistors.

14. The optical semiconductor device according to claim 13 wherein a load resistor is provided in said multi-layered semiconductor film.

* * * * *